United States Patent
Drewery et al.

(10) Patent No.: US 10,231,362 B1
(45) Date of Patent: Mar. 12, 2019

(54) HAZARD WARNING SYSTEM

(71) Applicant: INTERNATIONAL BUSINESS MACHINES CORPORATION, Armonk, NY (US)

(72) Inventors: Sarah M. Drewery, Winchester (GB); Colin Holyoake, Braishfield (GB); David J. Tolley, Southampton (GB); Julian D. Williams, Ringwood (GB)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/682,809

(22) Filed: Aug. 22, 2017

(51) Int. Cl.
*H05K 7/20* (2006.01)
*H02G 3/38* (2006.01)
*E04F 15/024* (2006.01)

(52) U.S. Cl.
CPC ... *H05K 7/20836* (2013.01); *E04F 15/02405* (2013.01); *H02G 3/385* (2013.01); *F24F 2221/40* (2013.01)

(58) Field of Classification Search
CPC ............. E04F 15/024; E04F 15/02447; E04F 15/02452; E04F 15/0258; E06B 2009/002; E06B 9/08; E06B 5/12; E06B 9/13; E06B 9/18; E06B 9/80; E06B 9/84; F24F 2221/40; F24F 13/068; E04G 21/32; E04G 21/3204; E04G 21/3223; E04G 2021/3257; E02D 29/127
USPC .......... 160/10, 21, 22, 26, 28, 31, 64; 52/29, 52/263, DIG. 12, 126.5, 126.6; 454/187
See application file for complete search history.

(56) References Cited

U.S. PATENT DOCUMENTS

| | | | | |
|---|---|---|---|---|
| 1,911,851 A | * | 5/1933 | Scholtz | F24F 13/08 454/289 |
| 2,958,083 A | * | 11/1960 | Shook | B63B 19/21 160/193 |
| 3,516,469 A | * | 6/1970 | McDonald | E06B 9/08 160/133 |
| 5,575,353 A | * | 11/1996 | Cafaro | E06B 9/02 160/24 |
| 5,937,593 A | * | 8/1999 | White | E04G 21/24 52/106 |

(Continued)

OTHER PUBLICATIONS

ASPLI Safety Ltd., "Telescopic Road Cone, Collapsible—Pop Up Portable Cone," http://www.aspli.com/products/1821/telescopic-road-cone-collapsible-pop-up-portable-cone?gclid=CjwKEAjw_MisBRCTuNPfoMqU4ngSJACrJv1V3yow0w1XpWTKVes9AyebOz2EBuZeYPbhel5i6WJzZxoCljXw_wcB, Printed on Aug. 16, 2017, pp. 1-2.

(Continued)

*Primary Examiner* — Robert Canfield
*Assistant Examiner* — Matthew J Gitlin
(74) *Attorney, Agent, or Firm* — Jordan T. Schiller

(57) ABSTRACT

A flooring element is used in a raised floor having removable flooring panels and a supporting structure and having a load bearing surface. The flooring element includes a roll of flexible sheet material mounted on the flooring element. The flooring element may include a flooring stringer or an insert. After removal of an overlying flooring panel to reveal an opening to a sub-floor void, the roll of flexible sheet material may be extended from the roll and affixed to an attachment means at an opposite side of the opening so as to substantially cover the opening and provide a warning of a removed panel.

18 Claims, 12 Drawing Sheets

(56) References Cited

U.S. PATENT DOCUMENTS

| | | | | |
|---|---|---|---|---|
| 6,057,029 | A * | 5/2000 | Demestre | E06B 5/12 |
| | | | | 160/120 |
| 6,280,320 | B1 * | 8/2001 | Paschke | F24F 13/0218 |
| | | | | 454/296 |
| 6,282,856 | B1 * | 9/2001 | MacKarvich | E02D 27/02 |
| | | | | 248/188.1 |
| 6,349,505 | B1 * | 2/2002 | Figge | E06B 5/12 |
| | | | | 49/64 |
| 6,676,205 | B2 * | 1/2004 | Lin | B60J 7/0015 |
| | | | | 296/214 |
| 6,705,796 | B2 | 3/2004 | Lund | |
| 7,413,000 | B2 * | 8/2008 | Lin | B60J 1/2025 |
| | | | | 160/265 |
| 7,735,278 | B2 | 6/2010 | Becker et al. | |
| 8,016,921 | B2 * | 9/2011 | Hassell | B01D 46/0002 |
| | | | | 55/356 |
| 9,016,669 | B2 | 4/2015 | Johnson et al. | |
| 9,394,700 | B1 | 7/2016 | Rodriguez | |
| 9,624,689 | B2 * | 4/2017 | Bailey | E04H 15/32 |
| 2003/0213191 | A1 * | 11/2003 | Jette | E04F 15/024 |
| | | | | 52/220.1 |
| 2005/0173078 | A1 * | 8/2005 | Perez, Jr. | A01K 1/035 |
| | | | | 160/99 |
| 2006/0060306 | A1 * | 3/2006 | Lukos | E04F 10/0662 |
| | | | | 160/22 |
| 2006/0124255 | A1 * | 6/2006 | Manzella | E06B 9/24 |
| | | | | 160/371 |
| 2010/0035538 | A1 * | 2/2010 | White | F24F 13/082 |
| | | | | 454/290 |
| 2010/0229916 | A1 * | 9/2010 | Bechamp | F24J 2/4609 |
| | | | | 136/244 |
| 2011/0061822 | A1 * | 3/2011 | Tremaine, III | E06B 9/0692 |
| | | | | 160/311 |
| 2011/0120027 | A1 * | 5/2011 | Massameno | E04G 21/3204 |
| | | | | 52/105 |
| 2011/0192328 | A1 * | 8/2011 | Frest | E04H 9/06 |
| | | | | 109/76 |
| 2014/0008595 | A1 | 1/2014 | O'Banion et al. | |
| 2014/0102829 | A1 * | 4/2014 | Stearns | A62B 1/22 |
| | | | | 182/139 |

OTHER PUBLICATIONS

Barriers Direct, "Retractable Tensa Stretch Belt Barriers," http://www.barriersdirect.co.uk/crowd-queue-control-c1119/retractable-tensa-barriers-c1009, Printed on Aug. 16, 2017, pp. 1-8.

Rubbermaid Products, "Rubbermaid Bins, Recycling Bins, Safety & Cleaning Products," Supplied by SoHo Consulting, http://www.rubbermaidproducts.co.uk/safety-products/barricades-pop-up-safety-cones/Fg9s11-mobile-safety-barricade-system?gclid=CjwKEAjw_MisBRCTuNPfoMqU4ngSJACrJv1VoHKCsQIOfFnfFODSAY-SXwydbQ7yMIkPYHznBtb7-xoCH77w_wcB, Copyright 2017 Rubbermaid Products, Printed on Aug. 16, 2017, pp. 1-2.

E1E10, "Cable Floor Grommets, Infill Pillows and Air Gap Foam," Environmental Server Simulators & IST Services, Bachmann, http://www.e1e10.com/cable-floor-grommets.shtml, Printed on Aug. 16, 2017, Copyright E1E10, pp. 1-6.

Upsite Technologies, "KoldLok Wave Raised Floor Grommet," EDP, http://www.edpeurope.com/wp-content/uploads/2015/08/EDP-KoldLok-Wave-Data-Sheet.pdf, Printed on Aug. 16, 2017, pp. 1-10.

McFarlane, "Warning: Failure to comply with data center maintenance is reckless," SearchDataCenter, http://searchdatacenter.techtarget.com/tip/Warning-Failure-to-comply-with-data-center-maintenance-is-reckless, Printed on Aug. 16, 2017, pp. 1-6.

The Workplace Depot, "Pop-Up Cones," https://www.theworkplacedepot.co.uk/pop-up-cones#vat, Printed on Aug. 16, 2017, pp. 1-3.

Wavyads, "Air Dancer Green mix of colors—Inflatable Balloon Advertising Fan blown Outdoor display," http://www.wavyads.com/inflatable-advertising-details-3.php, Printed on Aug. 16, 2017, pp. 1-4.

McFarlane, "Work from the ground up with a data center raised floor," SearchDataCenter, http://searchdatacenter.techtarget.com/tip/Work-from-the-ground-up-with-a-data-center-raised-floor, Copyright 2000-2017, TechTarget, Printed on Aug. 16, 2017, pp. 1-6.

\* cited by examiner

HAZARD WARNING SYSTEM

BACKGROUND

The present invention generally relates to a hazard warning system for a raised floor having removable flooring panels.

A raised floor is an elevated structural floor, spaced above a solid substrate to create a hidden sub-floor void. Many modern building environments incorporate a raised floor. The void provides for the passage of various building services such as electrical and optical cabling, plumbing, and underfloor air distribution. One example of such a building environment is a data center. A data center is typically a room in which rows of data processing and/or telecommunications equipment are installed, each separated from each other by intervening access aisles. The void beneath the raised floor provides space for the routing of services to and between the installed equipment, such as electrical power distribution cabling, communications cabling, plumbing for fluid cooling systems, and a plenum chamber for distribution of conditioned air.

SUMMARY

Embodiments of the invention provide a flooring element for a raised floor including removable flooring panels and a supporting structure and having a load bearing surface. The flooring element includes a roll of flexible material sheet mounted on the flooring element, the flexible material sheet being operable, after removal of an overlying flooring panel to reveal an opening to a sub floor void, for extending from the roll and for affixing to an attachment means at an opposite side of the opening so as to substantially cover the opening and provide a warning of a removed panel.

Embodiments of the invention provide a flooring stringer for forming a part of a supporting structure for a raised floor including removable flooring panels and a supporting structure and having a load bearing surface. The flooring stringer includes a roll of flexible material sheet mounted on the flooring stringer, the flexible material sheet being operable, after removal of an overlying flooring panel to reveal an opening to a sub floor void, for extending from the roll and for affixing to an attachment means at an opposite side of the opening so as to substantially cover the opening and provide a warning of a removed panel.

Embodiments of the invention provide an insert for positioning below a flooring panel of a raised floor including removable flooring panels and a supporting structure and having a load bearing surface. The insert includes a roll of flexible material sheet mounted on the insert. The flexible material sheet is operable, after removal of an overlying flooring panel to reveal an opening to a sub floor void, for extending from the roll and for affixing to an attachment means at an opposite side of the opening so as to substantially cover the opening and provide a warning of a removed panel.

Embodiments provide a flooring system including previous embodiments.

BRIEF DESCRIPTION OF THE DRAWINGS

Embodiments of the present invention will now be described, by way of example only, with reference to the following drawings in which.

DETAILED DESCRIPTION

Figure 1:
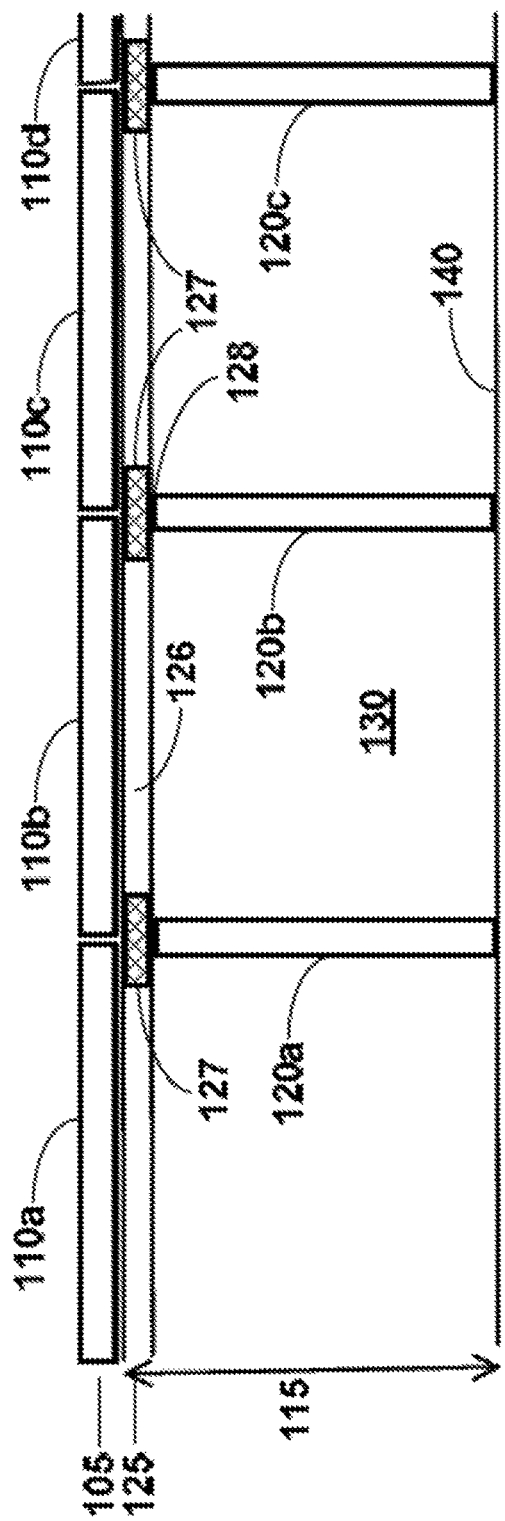
FIG. 1 is a cross sectional view of a raised floor system comprising flooring panels.

Embodiments of the invention provide a hazard warning system for a raised floor system. The hazard warning system comprises a hazard warning mechanism which is operable for deploying into a warning position when a corresponding panel of the raised floor is removed. Embodiments of the invention, when deployed, provide a further function of reducing escape of conditioned air from the sub-floor void.

A raised floor is an elevated structural floor, spaced above a solid substrate to create a hidden sub-floor void. The raised floor usually comprises a plurality of removable panels or tiles supported above the underlying substrate by a framework. The framework typically comprises a plurality of equally spaced vertical pedestals defining the height at which the raised floor is raised above the substrate, and thereby defining, along with the floor area, the enclosed volume of the void. The framework also typically comprises a plurality of horizontal stringers arranged in a grid structure of laterally disposed stringers superimposed upon longitudinally disposed stringers, with intersecting stringers meeting each other at right angles. The grid structure thereby divides the raised floor area into a two-dimensional array of spaces each sized to accommodate a floor panel or tile.

The grid structure is supported above the substrate by the pedestals. Each pedestal is typically situated with one end abutting the substrate and the other end supporting an intersection between a longitudinally disposed stringer and laterally disposed stringer. Depending on the load that the raised floor is expected to carry, not all intersections in the gird structure may be supported by a pedestal. It will be appreciated however that, if the raised floor is expected to be heavily loaded, every intersection may be supported by a pedestal. In another conventional raised flooring system, there are no stringers and instead each corner of a floor panel is supported by a separate pedestal so that, except at the edges of the raised floor, each pedestal supports the meeting corners of four adjacent panels. The substrate is typically a concrete floor. The stringers and pedestals are typically formed from a metal such as steel. The panels are typically formed from steel or steel-clad particleboard.

As indicated earlier, the panels are typically removable to facilitate access to the services in the void, for example for installation or maintenance. When a panel is removed, a potential hazard is created because personnel may not see the gap in the raised floor thereby created and inadvertently fall into the void, leading to possible injury. Conventionally, this problem has been addressed by the provision of portable warning signs or barriers. This conventional approach has disadvantages. Such barriers or signs may be removed, deliberately or inadvertently. Additionally, such barriers or signs must be stored when not in use and replaced after use, and the storage location needs to be convenient. It would be desirable to provide a hazard warning system which addresses these problems.

An additional problem arising from the removal of a flooring panel is that conditioned air circulating in the plenum chamber can escape via the gap thereby created. This escape may amount to as much as 350 liters per second from a standard sized flooring panel, for example. It would be desirable to provide a hazard warning system which also addresses this problem.

FIG. 1 illustrates an environment suitable for installation of embodiments of the present invention. A raised floor system comprises a raised floor 105 which is elevated above a solid substrate 140 to create a hidden sub-floor void 130. The void 130 provides for the passage of various building services such as electrical and optical cabling, plumbing, and underfloor air distribution (not shown). The raised floor 105 comprises a plurality of removable panels or tiles 110a-110d supported above the underlying substrate 140 by a framework 115.

The framework 115 comprises a plurality of equally spaced pedestals 120a-120c defining the height at which the raised floor 105 is raised above the substrate 140, and thereby defining, along with the floor area, the enclosed volume of the void 130. The framework 115 also comprises a plurality of stringers 125 arranged in a grid structure of laterally disposed stringers 126 superimposed upon longitudinally disposed stringers 127 with intersecting stringers meeting each other at right angles. The grid structure of stringers 125 thereby divides the raised floor area into a two-dimensional array of spaces each sized to accommodate a floor panel 110a-110d.

The grid structure of stringers 125 is supported above the substrate 140 by the pedestals 120a-120c. Each pedestal 120a-120c is situated with one end abutting the substrate 140 and the other end supporting an intersection 128 between a longitudinally disposed stringer 127 and laterally disposed stringer 126. In some embodiments of the present invention, not all intersections 128 in the grid structure may be supported by a pedestal 120a-120c. In other embodiments of the present invention, each intersection 128 in the grid structure is supported by a pedestal 120a-120c. The selection depends on the load that the raised floor is expected to carry.

The substrate 140 may be a concrete floor. The stringers 125 and pedestals 120a-120c may be formed from a metal such as steel. The panels 110a-110d may be formed from steel or steel-clad particleboard. It will be appreciated, however, that the present invention is not limited to raised floor systems involving such materials, or the combination thereof, and that, in other embodiments of the present invention, different materials, and/or combinations thereof, may be employed.

The panels 110a-110d are removable to facilitate access to the services in the void 130, for example for installation or maintenance. When a panel 110a-110d is removed, a potential hazard is created because personnel may not see the gap in the raised floor 105 thereby created and inadvertently fall into the void 140, leading to possible injury.

Figure 2:
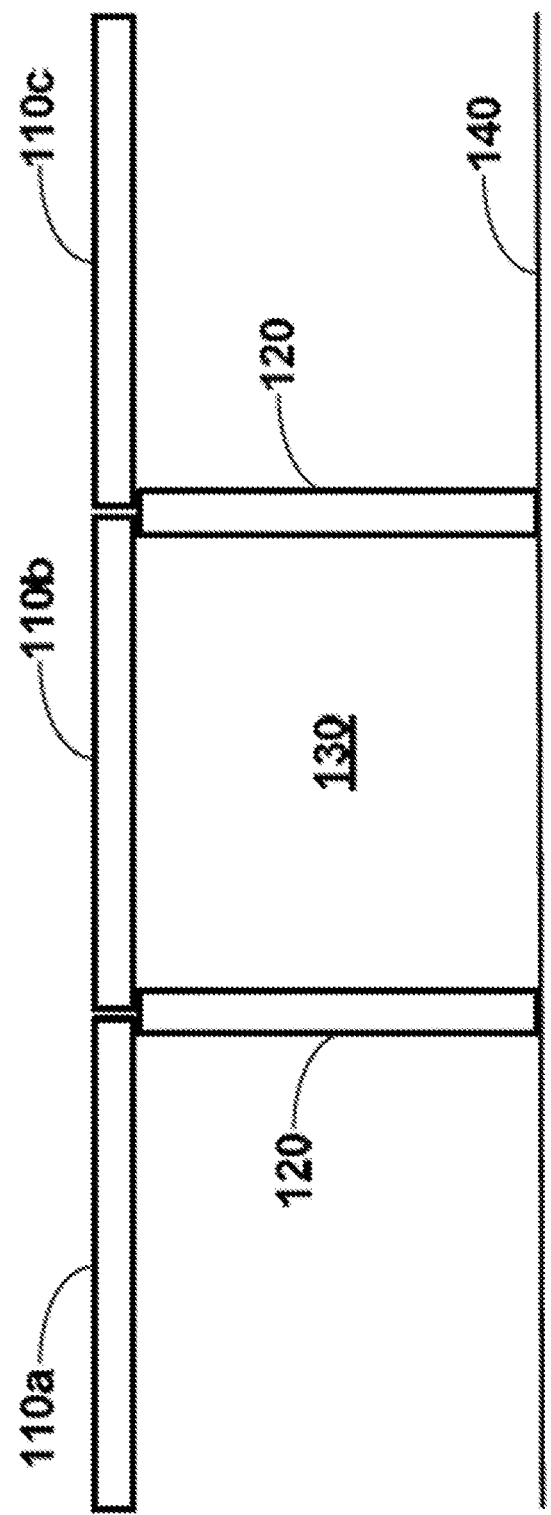
FIG. 2 is a cross sectional view of an alternative design of raised floor system comprising flooring panels.

FIG. 2 illustrates an alternative environment suitable for installation of embodiments of the present invention. In this environment, there are no stringers and instead each corner of a panel, 110a-110c illustrated, is supported by a separate pedestal 120 so that, except at the edges of the raised floor 105, each pedestal 120 supports the meeting corners of four adjacent panels 110a-110c illustrated.

Figure 3:
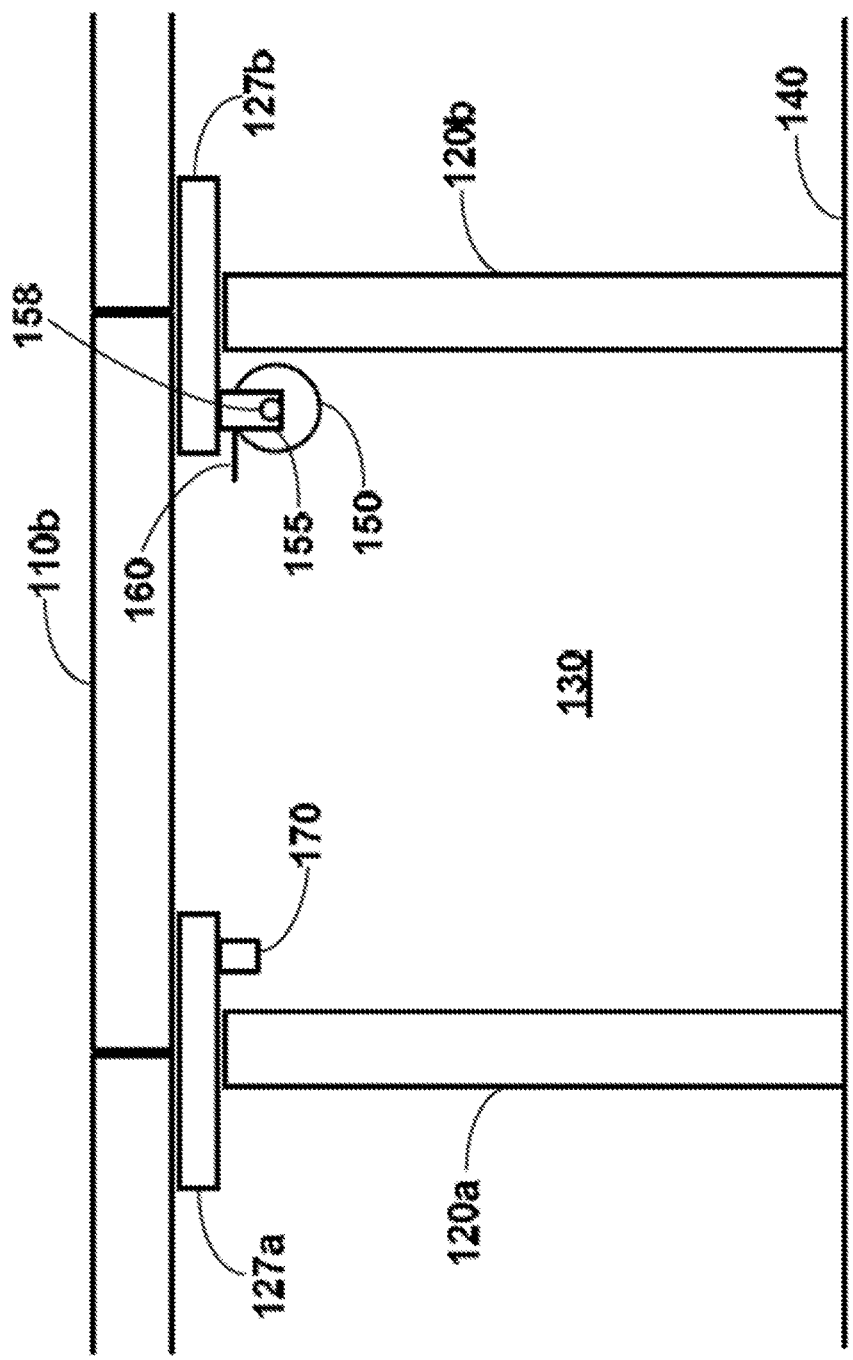
FIG. 3 is a cross sectional view of an embodiment of the present invention.

FIG. 3 illustrates a cross sectional view of a portion of a raised floor system comprising an embodiment of the present invention. Pedestals, 120a and 120b illustrated, support respectively longitudinal stringers 127a and 127b. Lateral stringers are not shown for clarity. Removable flooring panel 110b sits on the stringers. A first part of the embodiment comprises a roll 150 of flexible material sheet 160. Stringer 127b supports a mounting structure for roll 150 on its underside. Mounting means 155 at each end of the roll and attached to stringer 127b support the roll, for example by an axle 158 extending along the longitudinal axis of the roll 150 between and rotatable in respective mounts 155. Roll 150 of flexible material sheet 160 is operable for extending from roll 150 by pulling of its free end. Roll 150 is operable for extending laterally over substantially the full width of the space occupied by panel 110b.

Figure 4:
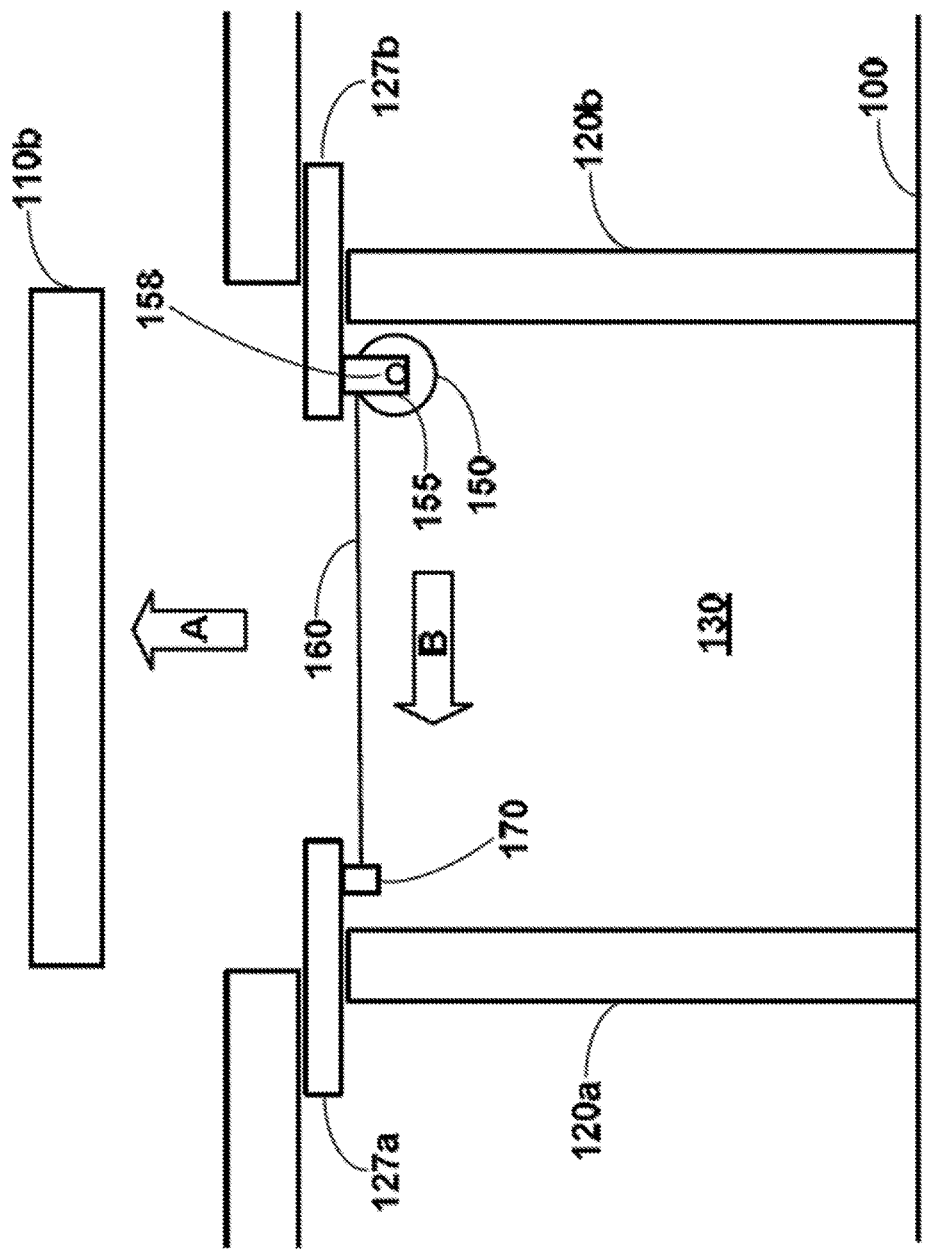
FIG. 4 is a cross sectional view of the embodiment of FIG. 3 in operation.

FIG. 4 illustrates the embodiment of FIG. 3 in operation. An operator removes, in direction of arrow A, flooring panel 110b exposing sub-floor void 130. The operator extends flexible material sheet 160 from roll 150 by pulling from its free edge in direction of arrow B. Stringer 127a comprises an attachment point 170 on its underside. Attachment point 170 comprises an attachment means to which free end of flexible material sheet 160 may be attached and retained. Attachment means 170 may, for example, comprise an eye or eyes engageable by a hook or hooks mounted on free edge of flexible material sheet 160. It will be apparent that attachment means 170 may comprise any suitable attaching and retaining mechanism without departing from the scope of the invention. Preferably, mounting means 155 or axle 158 comprise biasing means biased for retracting flexible material sheet 160 on to roll 150. The operator overcomes resistance of the biasing means when extending flexible sheet material 160 and, once attached to it, attachment point 170 retains flexible material sheet 160 and prevents retraction towards roll 150.

Figure 5:
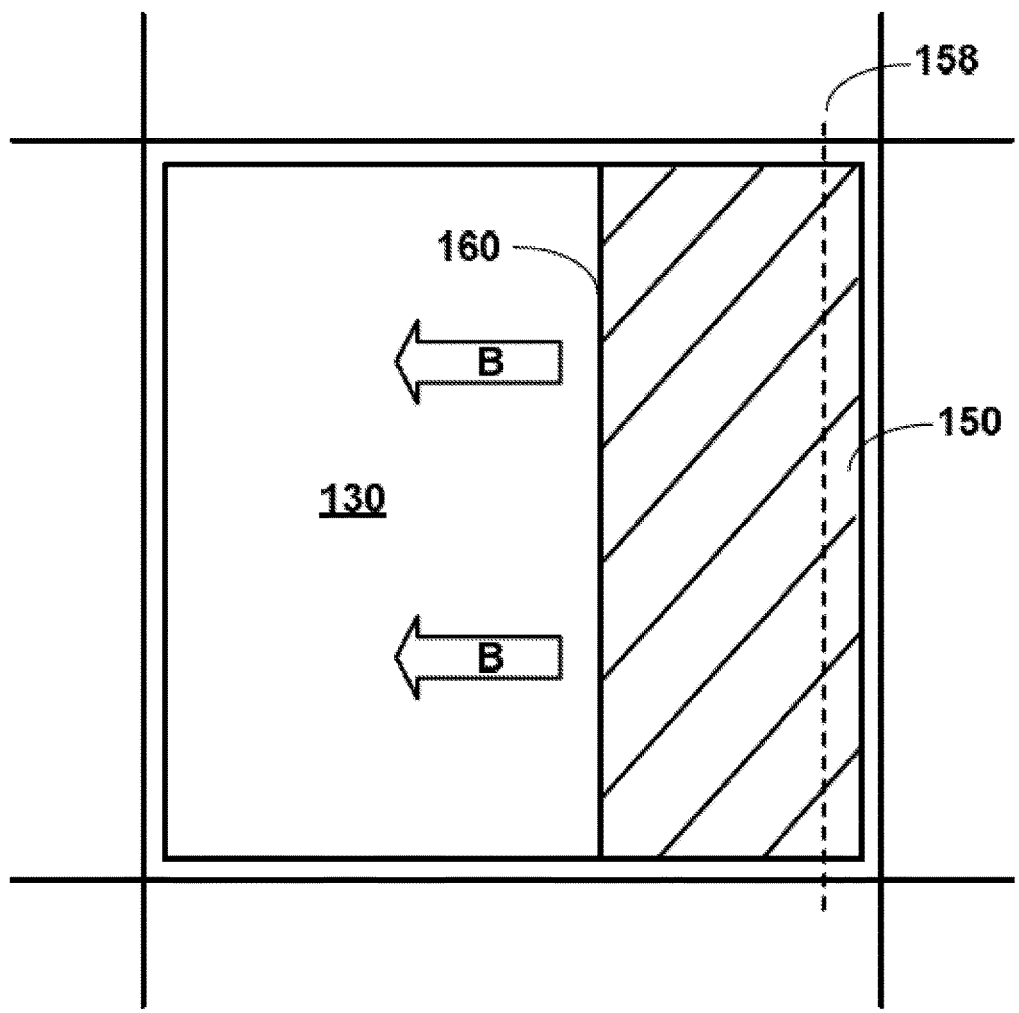
FIG. 5 is a plan view illustrating operation of an embodiment of the present invention.
Figure 6:
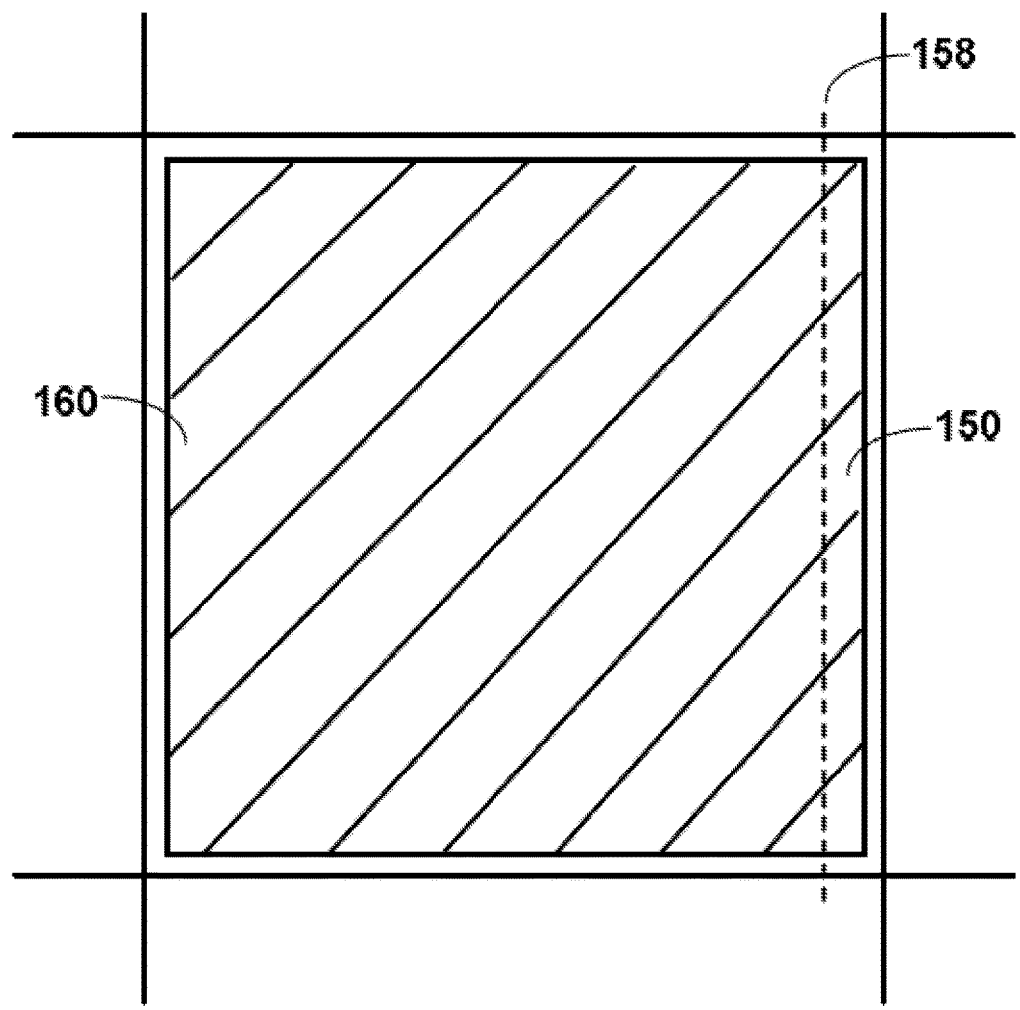
FIG. 6 is a plan view of an embodiment of the present invention after deployment.

FIG. 5 and FIG. 6 illustrate a plan view of the embodiment of FIG. 3 and FIG. 4 in operation. In FIG. 5, the operator extends flexible material sheet 160 from roll 150 across exposed void space 130. Position of mounting axle 158 is shown by a dashed line. In FIG. 6, the operator attaches the free end of flexible material sheet 160 to attachment point 170 so that the exposed void space is substantially covered. Preferably, flexible material sheet 160 comprises warning indicia on its surface exposed to view when extended, i.e. its upper facing surface when extended, to act as a warning to data center personnel of a removed floor panel. This may comprise, for example, brightly colored alternating stripes. Flexible material sheet 160 may comprise any suitable material. For example, flexible material sheet 160 may comprise an elastomeric material, a woven material or some other cloth or plastics material, or combination thereof.

Figure 7:
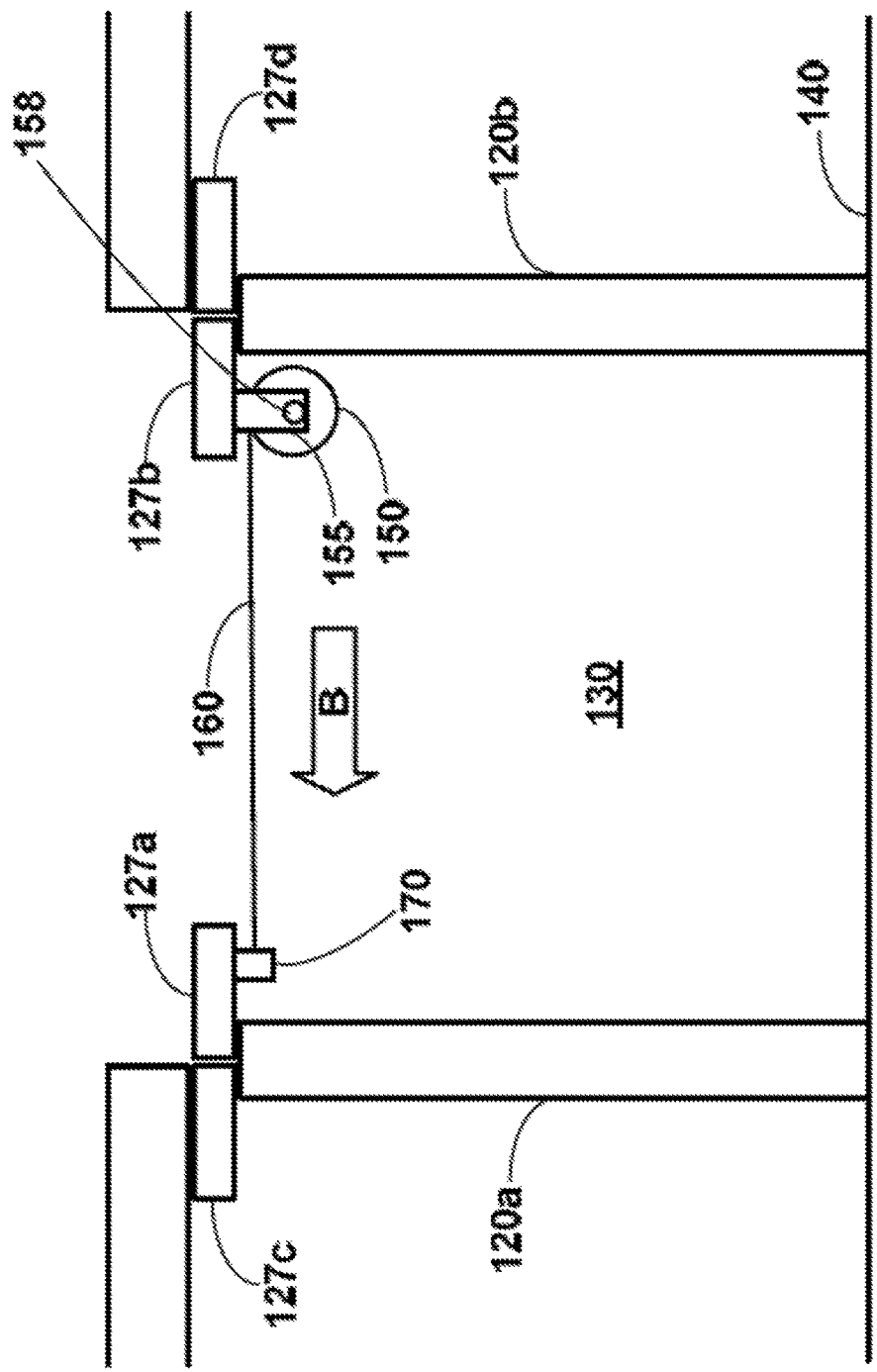
FIG. 7 is a cross sectional view of an alternative embodiment of the present invention.

FIG. 7 illustrates an alternative embodiment of the invention in which a longitudinal stringer is replaced by a pair of adjacent longitudinal stringers so that each longitudinal stringer extends laterally over one side only of a given pedestal. Operation of the embodiment is the same as previously described.

Figure 8:
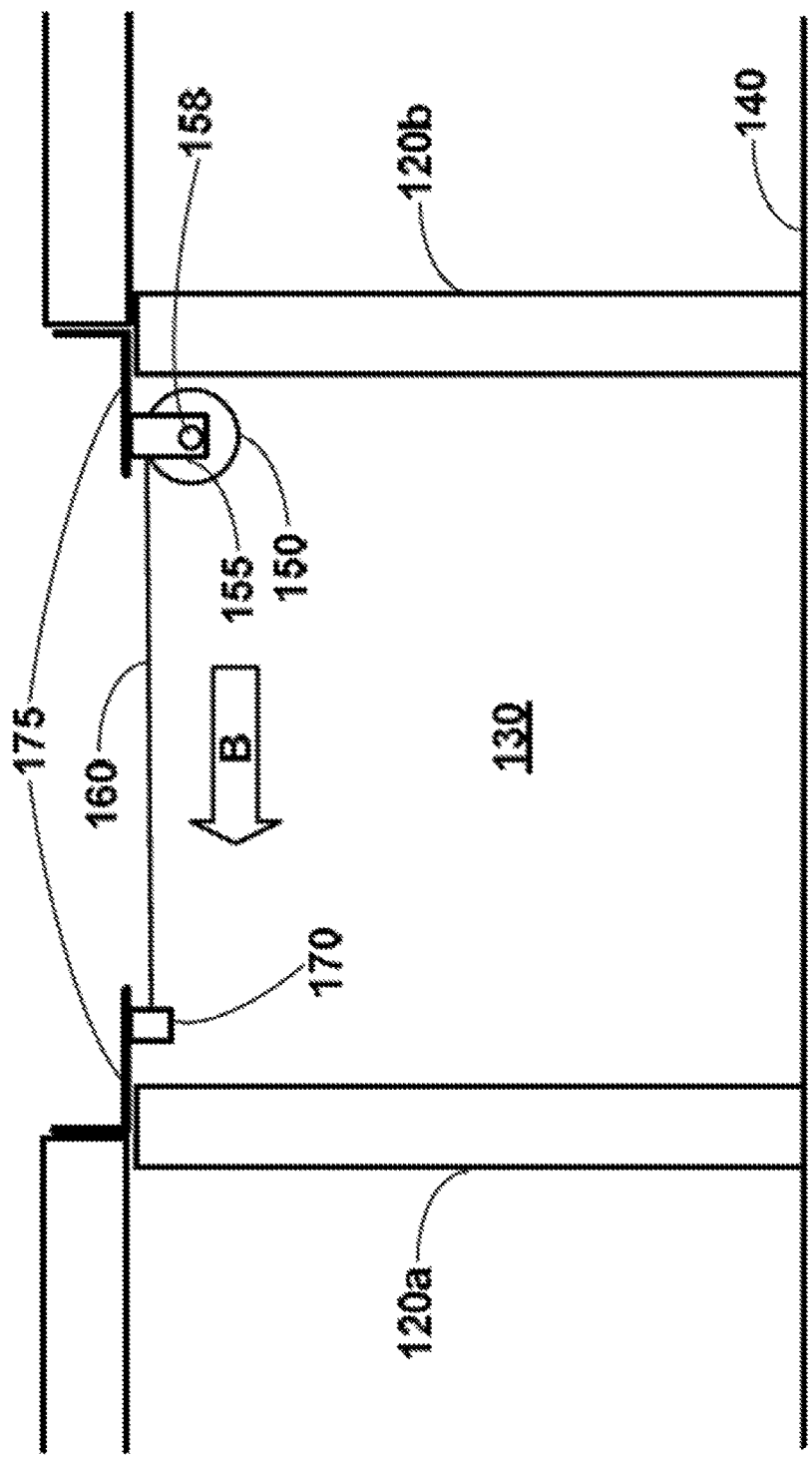
FIG. 8 is a cross sectional view of another alternative embodiment of the present invention.

FIG. 8 illustrates another alternative embodiment of the invention. This embodiment is suitable for installing in a flooring system which does not comprise stringers as shown in FIG. 2, although it might also be adapted for use in the flooring system comprising stringers as shown in FIG. 1. This embodiment comprises an insert 175. Insert 175 comprises a rectangular metal frame shaped for insertion in the space occupied by a removable flooring panel 110b. The rectangular metal frame may comprise an L-shaped cross sectional form. After inserting the insert in the flooring panel space, an operator may install flooring panel 110b in turn so that it sits within the insert and flush with the existing floor top surface. In this embodiment, one side of rectangular frame of insert 175 comprises roll 150 mounted below its horizontal part and attachment point 170 mounted below the horizontal part of the opposite side of the frame. Operation is the same as described with reference to previous embodiments.

Figure 9:
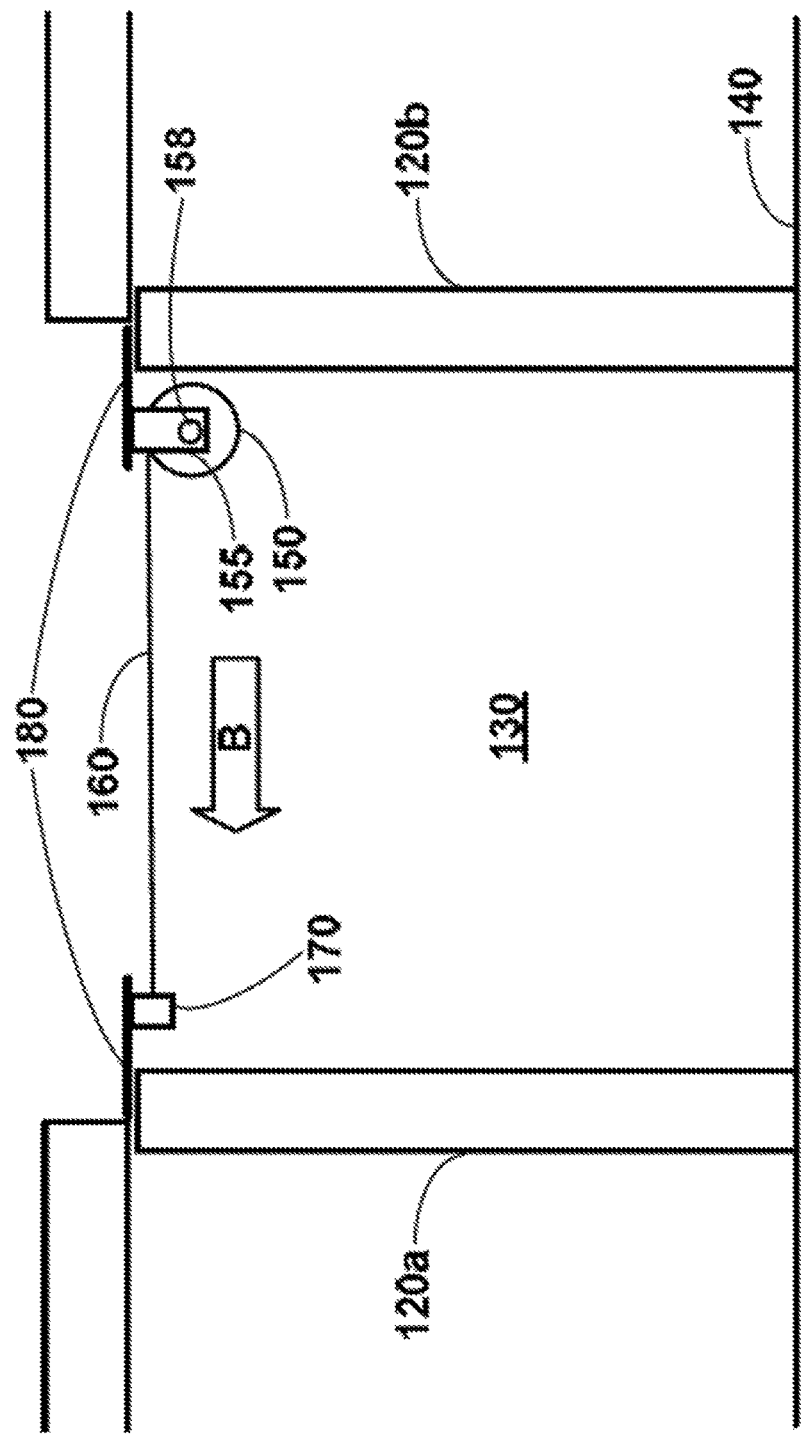
FIG. 9 is a cross sectional view of another alternative embodiment of the present invention.

FIG. 9 illustrates a variation on the embodiment of FIG. 8. In this embodiment, insert 180 comprises a flat section rectangular frame, and is therefore similar to the embodiment of FIG. 8 but without the vertical portion. This embodiment is otherwise identical in operation to the embodiment of FIG. 8.

Figure 10:
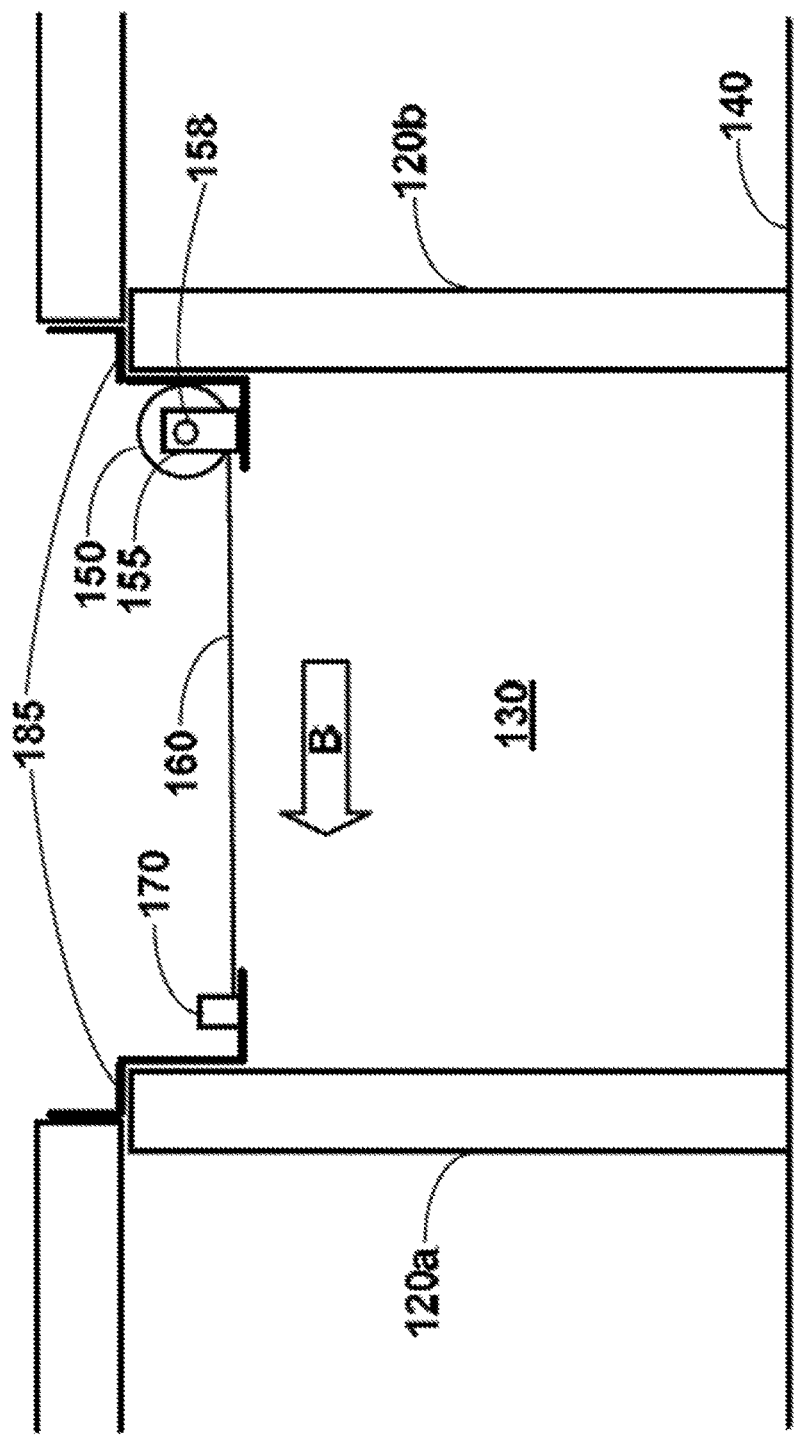
FIG. 10 is a cross sectional view of another alternative embodiment of the present invention.

FIG. 10 illustrates another alternative embodiment comprising another design of insert. Insert 185 comprises a metal frame comprising a double L shaped cross section. Insert 185 sits in the space of removable flooring panel 110b, as does insert 170 of FIG. 8. Insert 185 comprises a second L shaped cross section part below the first. In this embodiment, the lower L section of one side of the frame mounts roll 150 on its upper horizontal surface and attachment point 170 on upper surface of the opposite side. In operation, an operator extends flexible material sheet 160 from roll 150 as in previously described embodiments.

Figure 11:
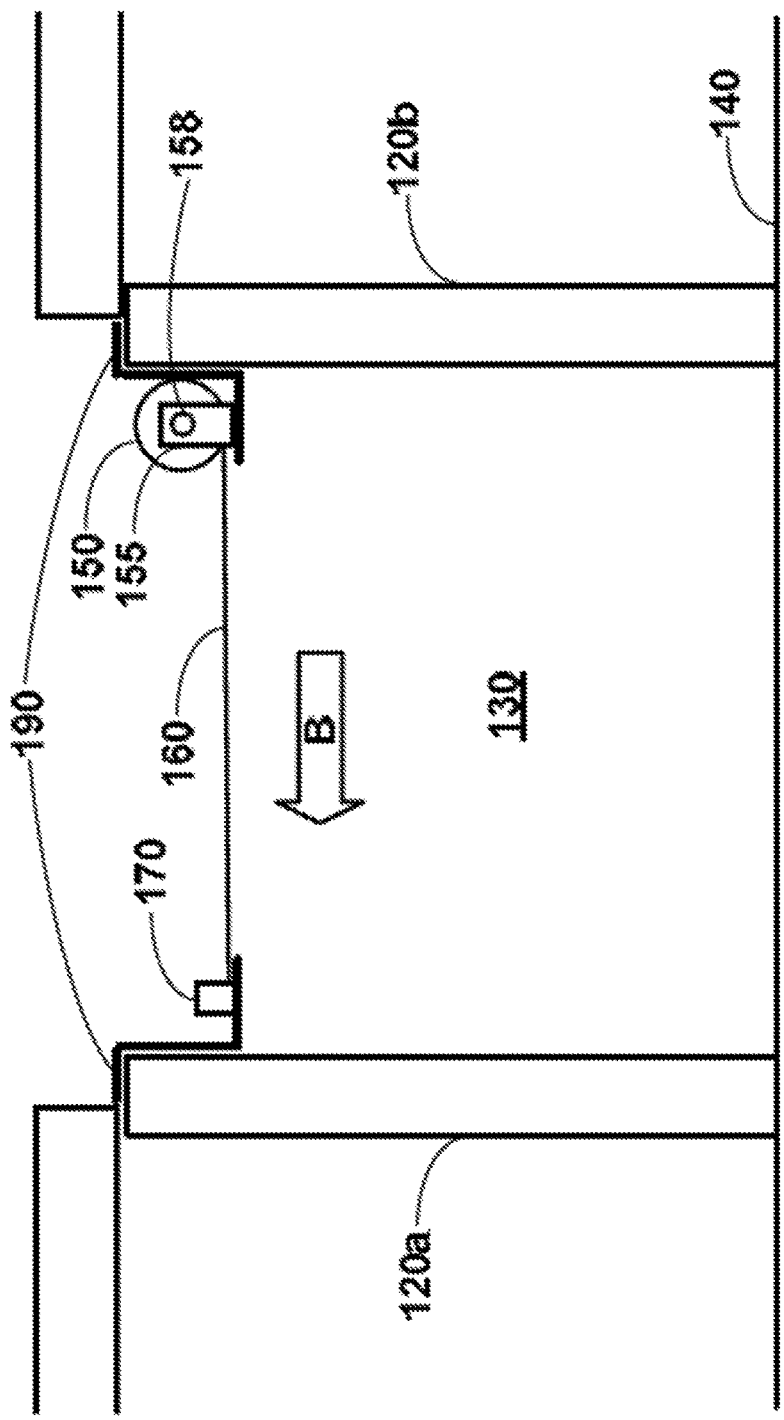
FIG. 11 is a cross sectional view of yet another alternative embodiment of the present invention.

FIG. 11 illustrates a further alternative embodiment comprising another design of the insert. In this embodiment the insert 190 comprises a combination of the features of embodiments of FIG. 9 and FIG. 10. In this embodiment, the lower L shaped section, as in the embodiment of FIG. 10, combines with a flat section as in the embodiment of FIG. 9 so that an inserted flooring panel sits on the flat section and a lower L shaped section extends below it, as in FIG. 10.

Where sub-floor void 130 is used to circulate conditioned air, flexible material sheet 160, when deployed as described with reference to previous embodiments, may serve a further purpose of preventing excessive escape of air from sub-floor void 130. Flexible material sheet 160 may be mounted so that when deployed it seals respective opposite edges of the space left by a removed floor panel at positions of roll 150 and attachment means 170. It may further be mounted so as to seal the remaining two opposite edges of the space by providing retaining means, for example channels, at these remaining space edges. Edges of the flexible material sheet may be retained by these retaining means such as channels during deployment of the flexible material sheet and once it is deployed.

Figure 12:
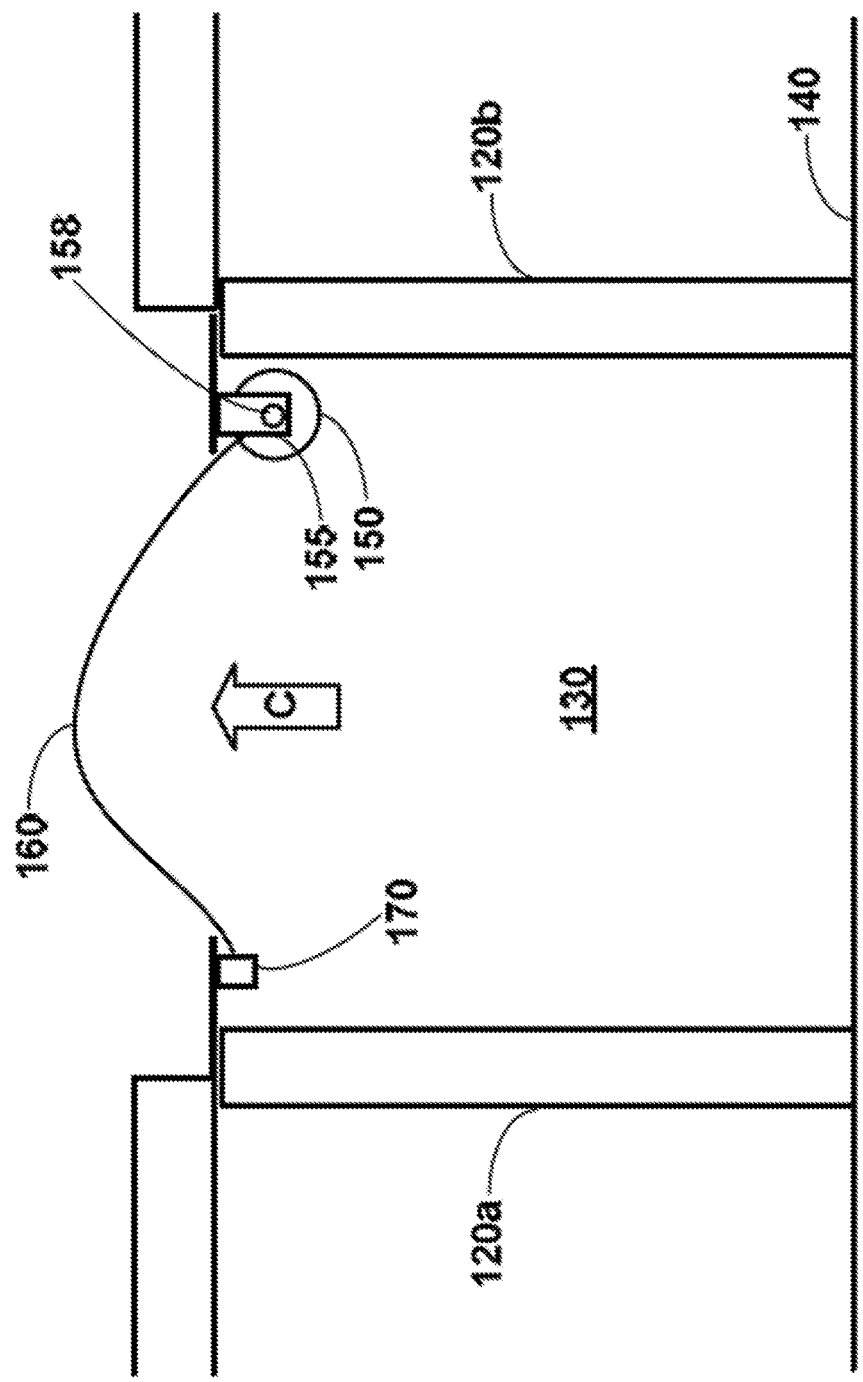
FIG. 12 is a cross sectional view of a further illustrative embodiment of the present invention.

FIG. 12 illustrates an embodiment of the invention incorporating these features. It is illustrated with reference to the embodiment of FIG. 9, but the skilled person will understand that it might be employed in any of the previously described embodiments. In the embodiment, when flexible material sheet 160 is in the deployed position as illustrated, flexibility of the material of sheet 160 allows bowing of sheet 160 upwards in the direction of arrow C in response to pressure of circulating conditioned air in sub-floor void 130. The material of flexible material sheet 160 may be selected to provide mechanical properties to produce a desired degree of upward bowing when deployed. The material of flexible material sheet 160 may be selected for composition, flexibility, thickness or any other property. The degree of bowing may be chosen so as to provide a conspicuous raised structure when deployed to serve as a prominent warning to personnel of a removed floor panel. This enhanced warning effect may be further enhanced by applying a suitable warning indicia to the visible upper surface of flexible material sheet 160. This may be, for example, alternating stripes of a highly visible color or colors as previously described.

In some embodiments, inserts may be attached by fastening means directly to pedestals or to stringers if they are present. In other embodiments, inserts sit in the flooring panel spaces without attachment. Embodiments of the invention comprise a flooring element which mounts a roll of flexible material. The flooring element may comprise a modified stringer, or an insert, which mounts the roll of flexible material. It will be apparent that further embodiments may be envisaged without departing from the scope of the invention.

The invention claimed is:

1. A flooring element for a raised floor comprising one or more removable flooring panels and a supporting structure and having a load bearing surface, the flooring element comprising:
   a roll of flexible material sheet mounted to the raised floor, the roll of flexible material sheet being operable, after removal of an overlying flooring panel to reveal an opening to a sub-floor void, for extending from the roll of flexible material sheet and for affixing to an attachment point at an opposite side of the opening to the sub-floor void so as to substantially cover the opening and provide a warning after removal of the overlaying flooring panel, wherein the roll of flexible material sheet when deployed is bowed upwards responsive to pressure of conditioned air in the sub-floor void so as to provide increased visibility and an enhanced warning effect.

2. The flooring element of claim 1, wherein the flooring element mounting the roll of flexible material sheet comprises a flooring stringer.

3. The flooring element of claim 2, wherein the roll of flexible material sheet is mounted to a lower horizontal surface of the flooring stringer.

4. The flooring element of claim 1, wherein the flooring element mounting the roll of flexible material sheet comprises an L-shaped mounting bracket that is placed in a space previously occupied by a flooring panel after removal of the overlaying flooring panel.

5. The flooring element of claim 4, wherein the L-shaped mounting bracket comprises a rectangular frame.

6. The flooring element of claim 5, wherein the roll of flexible material sheet is mounted to a lower horizontal surface of the rectangular frame.

7. The flooring element of claim 5, wherein the roll of flexible material sheet is mounted to an upper horizontal surface of the rectangular frame.

8. The flooring element of claim 1, wherein the roll of flexible material sheet comprises one of: an elastomeric material, a woven material, a cloth material, a plastics material, or a combination thereof.

9. The flooring element of claim 1, wherein the roll of flexible material sheet comprises warning indicia visible when the roll of flexible material sheet is extended.

10. The flooring element of claim 1, wherein the flooring element is a component of a flooring system.

11. A flooring stringer for forming a part of a supporting structure for a raised floor comprising one or more removable flooring panels having a load bearing surface, the flooring stringer comprising:
a roll of flexible material sheet mounted to a lower horizontal surface of the raised floor, the roll of flexible material sheet being operable, after removal of an overlying flooring panel to reveal an opening to a sub-floor void, for extending from the roll of flexible material sheet and for affixing to an attachment point at an opposite side of the opening to the sub-floor void so as to substantially cover the opening and provide a warning after removal of the overlaying flooring panel, wherein the roll of flexible material sheet when deployed is bowed upwards responsive to pressure of conditioned air in the sub-floor void so as to provide increased visibility and an enhanced warning effect.

12. An L-shaped mounting bracket for positioning below a flooring panel of a raised floor comprising one or more removable flooring panels and a supporting structure and having a load bearing surface, the L-shaped mounting bracket comprising:
a roll of flexible material sheet mounted to the raised floor, the roll of flexible material sheet being operable, after removal of an overlying flooring panel to reveal an opening to a sub-floor void, for extending from the roll of flexible material sheet and for affixing to an attachment point at an opposite side of the opening to the sub-floor void so as to substantially cover the opening and provide a warning after removal of the overlaying flooring panel, wherein the roll of flexible material sheet when deployed is bowed upwards responsive to pressure of conditioned air in the sub-floor void so as to provide increased visibility and an enhanced warning effect.

13. The L-shaped mounting bracket of claim 12, wherein the L-shaped mounting bracket comprises a rectangular frame.

14. The L-shaped mounting bracket of claim 13, wherein the roll of flexible material sheet is mounted to a lower horizontal surface of the rectangular frame.

15. The L-shaped mounting bracket of claim 13, wherein the roll of flexible material sheet is mounted to an upper horizontal surface of the rectangular frame.

16. The L-shaped mounting bracket of claim 12, wherein the roll of flexible material sheet comprises one of: an elastomeric material, a woven material, a cloth material, a plastics material, or a combination thereof.

17. The L-shaped mounting bracket of claim 12, wherein the roll of flexible material sheet comprises warning indicia visible when the roll of flexible material sheet is extended.

18. The L-shaped mounting bracket of claim 12, wherein the L-shaped mounting bracket is a component of a flooring system.

* * * * *